(12) United States Patent
Zou et al.

(10) Patent No.: US 8,465,297 B2
(45) Date of Patent: Jun. 18, 2013

(54) SELF REFERENCING PIN

(75) Inventors: Bin Zou, Chandler, AZ (US); Yan Guo, Chandler, AZ (US); Robert L. Sankman, Phoenix, AZ (US); Jiangqi He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/890,646

(22) Filed: Sep. 25, 2010

(65) Prior Publication Data

US 2012/0077357 A1 Mar. 29, 2012

(51) Int. Cl.
*H01R 12/00* (2006.01)

(52) U.S. Cl.
USPC .......................................................... 439/65

(58) Field of Classification Search
USPC ................. 439/65, 131, 76.1, 578, 607.1, 79
See application file for complete search history.

(56) References Cited

U.S. PATENT DOCUMENTS

| | | | |
|---|---|---|---|
| 4,451,107 A * | 5/1984 | Dola et al. .................. | 439/607.1 |
| 4,819,131 A | 4/1989 | Watari | |
| 5,127,839 A * | 7/1992 | Korsunsky et al. ............. | 439/79 |
| 5,199,880 A * | 4/1993 | Arai ................................ | 439/65 |
| 6,288,372 B1 * | 9/2001 | Sandberg et al. ............. | 219/544 |
| 6,388,208 B1 | 5/2002 | Kiani et al. | |
| 6,443,740 B1 * | 9/2002 | Evans ............................. | 439/63 |
| 6,805,586 B2 * | 10/2004 | Akama et al. ............. | 439/607.07 |
| 7,331,820 B2 * | 2/2008 | Burris et al. .................. | 439/578 |
| 7,752,383 B2 * | 7/2010 | Cheng et al. .................. | 711/103 |
| 8,021,166 B1 * | 9/2011 | Nguyen et al. ............... | 439/76.1 |
| 8,043,099 B1 * | 10/2011 | Ni et al. ......................... | 439/131 |
| 2004/0118877 A1 * | 6/2004 | von Schuckmann et al. . | 222/382 |
| 2005/0262910 A1 * | 12/2005 | DeVries ......................... | 70/491 |
| 2007/0085191 A1 | 4/2007 | Nobutaka et al. | |
| 2011/0300724 A1 * | 12/2011 | Nguyen et al. ............... | 439/76.1 |

FOREIGN PATENT DOCUMENTS

JP 9-17535 A 1/1997

OTHER PUBLICATIONS

International Search Report and Written Opinion Received for PCT Application No. PCT/US2011/053273, mailed on May 3, 2012, 10 pages.
International Preliminary Report on Patentability Received for PCT Application No. PCT/US2011/053273, mailed on Apr. 4, 2013, 7 pages.

* cited by examiner

*Primary Examiner* — Jean F Duverne
(74) *Attorney, Agent, or Firm* — Caven & Aghevli LLC

(57) ABSTRACT

Methods and apparatus relating to self-referencing pins are described. In one embodiment, a pin electrically couples a first agent to a second agent. The pin includes two or more portions that are at least partially separated by an insulator, e.g., to improve crosstalk performance. Other embodiments are also disclosed and claimed.

18 Claims, 8 Drawing Sheets

US 8,465,297 B2

SELF REFERENCING PIN

FIELD

The present disclosure generally relates to the field of electronics. More particularly, some embodiments relate to a self referencing pin.

BACKGROUND

In the existing semiconductor package designs, the crosstalk induced by socket pins is one of the most important bottlenecks in achieving electrical performance for the interconnect(s) on the package. One current solution is to carefully design the package pin map to isolate the high speed signals from their neighbors, e.g., by using a relatively large number of Vss pins to separate byte lanes and channels. However, the crosstalk from the socket pin could still easily reach a value that would outweigh such crosstalk reduction layout efforts both on package and motherboard. In addition, adding more Vss pins on the pin map will result in package size growth and/or cost increase.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, some embodiments may be practiced without the specific details. In other instances, well-known methods, procedures, components, and circuits have not been described in detail so as not to obscure the particular embodiments.

Some embodiments provide several techniques for self-referencing socket pins. In an embodiment, a socket and package structure is disclosed that significantly reduces the crosstalk induced on a socket pin so that the electrical performance on the second level interconnects for the high speed signals would be considerably improved. Moreover, such techniques make it possible to greatly shrink the package size, e.g., by reducing the number of Vss pins needed on the conventional pin map.

In one embodiment, dielectric insulator may be provided between a plurality of portions of a socket pin as will be further discussed below. The pin may be attached to a socket, package, or motherboard (which are manufactured to receive the new pin design). The pin portions may have any shape, including half moon, rectangular, square, circular, or combinations thereof. Also, various material may be used to construct the pin and pin receptacle (e.g., in a socket, motherboard, or package), as will be further discussed below.

Moreover, new socket and package system designs disclosed herein directly address the physical structure shortfalls of existing socket pins in accordance with some embodiments. As a result, the crosstalk from the socket pin may be significantly reduced. Also, the Vss pins needed in the conventional pin map (for example, to shield the high speed signals) may become unnecessary such that the package size will be reduced, as well as the manufacturing/implementation costs. Also, the techniques discussed herein may be manufacturable on socket, package, and/or motherboard of a computing device, in various embodiments.

Figure 1:
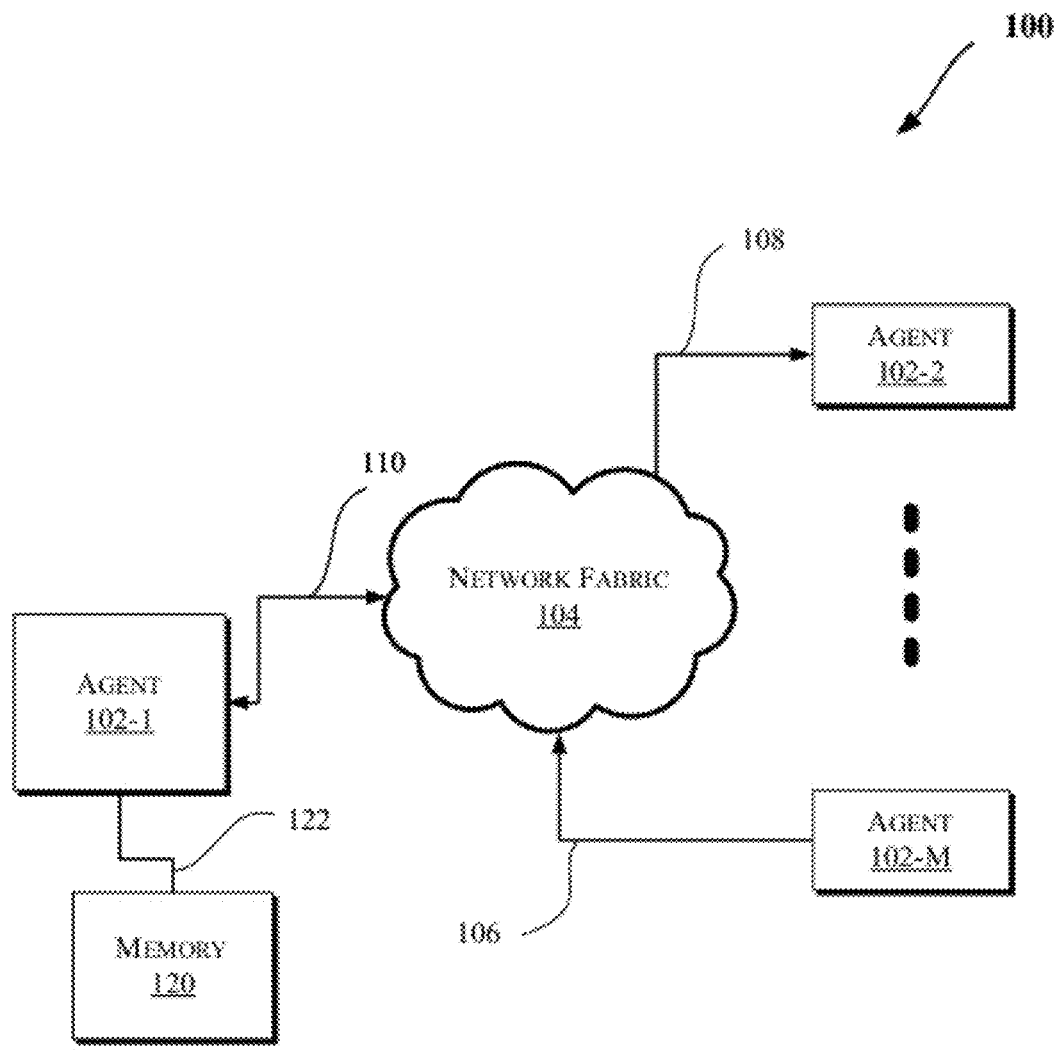
FIGS. 1-2 and 11-12 illustrate block diagrams of embodiments of computing systems or platforms, which may be utilized to implement various embodiments discussed herein.

Various computing systems may be used to implement embodiments, discussed herein, such as the systems discussed with reference to FIGS. 1-2 and 11-12. More particularly, FIG. 1 illustrates a block diagram of a computing system 100, according to an embodiment of the invention. The system 100 may include one or more agents 102-1 through 102-M (collectively referred to herein as "agents 102" or more generally "agent 102"). In an embodiment, one or more of the agents 102 may be any of components of a computing system, such as the computing systems discussed with reference to FIGS. 11-12.

As illustrated in FIG. 1, the agents 102 may communicate via a network fabric 104. In one embodiment, the network fabric 104 may include a computer network that allows various agents (such as computing devices) to communicate data. In an embodiment, the network fabric 104 may include one or more interconnects (or interconnection networks) that communicate via a serial (e.g., point-to-point) link and/or a shared communication network. For example, some embodiments may facilitate component debug or validation on links that allow communication with fully buffered dual in-line memory modules (FBD), e.g., where the FBD link is a serial link for coupling memory modules to a host controller device (such as a processor or memory hub). Debug information may be transmitted from the FBD channel host such that the debug information may be observed along the channel by channel traffic trace capture tools (such as one or more logic analyzers).

In one embodiment, the system 100 may support a layered protocol scheme, which may include a physical layer, a link layer, a routing layer, a transport layer, and/or a protocol layer. The fabric 104 may further facilitate transmission of data (e.g., in form of packets) from one protocol (e.g., caching processor or caching aware memory controller) to another protocol for a point-to-point or shared network. Also, in some embodiments, the network fabric 104 may provide communication that adheres to one or more cache coherent protocols.

Furthermore, as shown by the direction of arrows in FIG. 1, the agents 102 may transmit and/or receive data via the network fabric 104. Hence, some agents may utilize a unidirectional link while others may utilize a bidirectional link for communication. For instance, one or more agents (such as agent 102-M) may transmit data (e.g., via a unidirectional link 106), other agent(s) (such as agent 102-2) may receive data (e.g., via a unidirectional link 108), while some agent(s) (such as agent 102-1) may both transmit and receive data (e.g., via a bidirectional link 110). Also, at least one of the agents 102 (e.g., 102-1 as illustrated in FIG. 1) may have access to a memory 120 via a physical interface 122 (e.g., including one or more pins such as discussed herein with reference to FIGS. 2-12). Also, one or more of the links 106-110 may be implemented through one or more pins (such as discussed herein with reference to FIGS. 2-12) in accordance with some embodiments.

Figure 2:
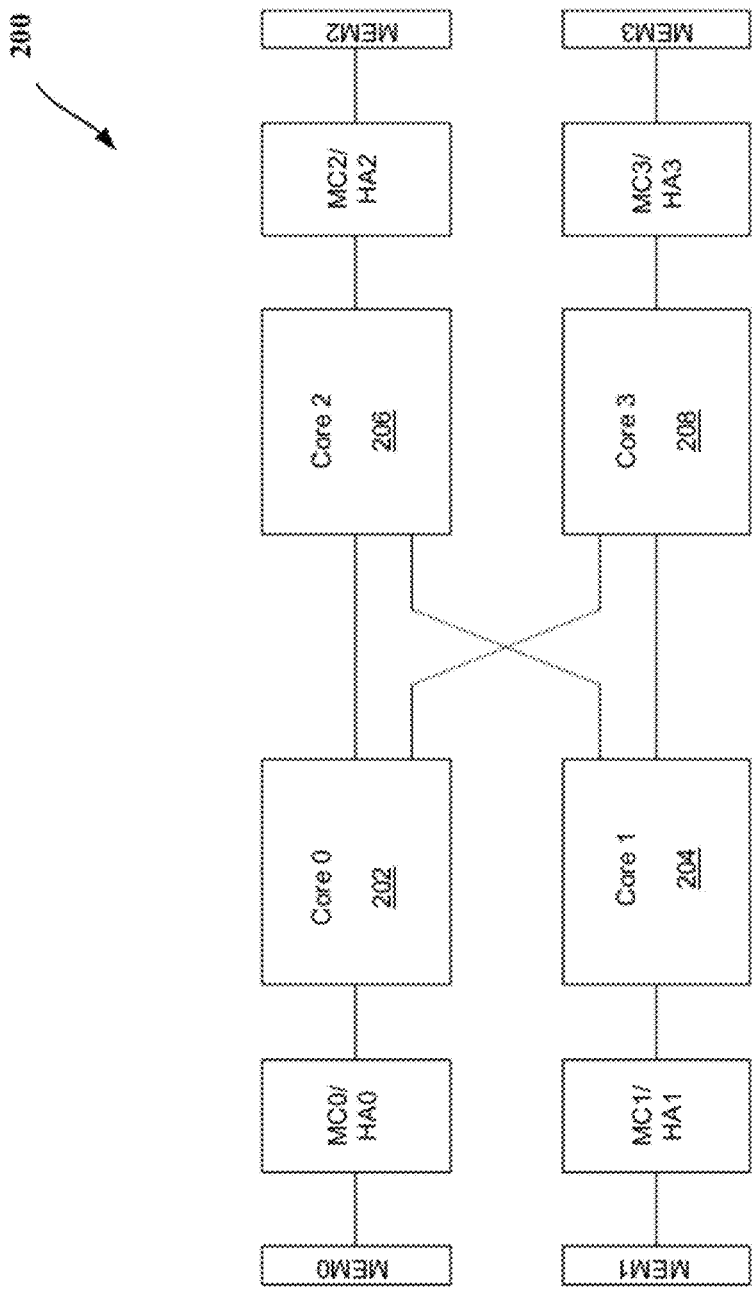

FIG. 2 is a block diagram of a computing system in accordance with an embodiment. System 200 may include a plurality of sockets 202-208 (four shown but some embodiments may have more or less socket). Each socket may include a processor in an embodiment. Also, each socket may be coupled to the other sockets via point-to-point (PtP) link such as discussed with reference FIG. 12. As discussed with respect the network fabric 104 of FIG. 1, each socket may be coupled to a local portion of system memory, e.g., formed of a plurality of Dual Inline Memory Modules (DIMMs) that may include dynamic random access memory (DRAM). Also, each socket may be coupled to various components via one or more pins (e.g., such as discussed herein with reference to FIGS. 1 and 3-12)

As shown in FIG. 2, each socket may be coupled to a memory controller (MC)/Home Agent (HA) (such as MC0/HA0 through MC3/HA3). The memory controllers may be coupled to a corresponding local memory (labeled as MEM0 through MEM3), which may be a portion of system memory (such as memory 1112 of FIG. 11). In some embodiments, the memory controller (MC)/Home Agent (HA) (such as MC0/HA0 through MC3/HA3) may be the same or similar to agent 102-1 of FIG. 1 and the memory, labeled as MEM0 through MEM3, may be the same or similar to memory 120 of FIG. 1. Generally, processing/caching agents may send requests to a home node for access to a memory address with which a corresponding "home agent" is associated. Also, in one embodiment, MEM0 through MEM3 may be configured to mirror data, e.g., as master and slave. Also, one or more components of system 200 may be included on the same integrated circuit die in some embodiments.

An implementation such as shown in FIG. 2 thus may be for a socket glueless configuration with mirroring. For example, data assigned to a memory controller (such as MC0/HA0) may be mirrored to another memory controller (such as MC3/HA3) over the PtP links. Also, the directory associated with memory controller MC3/HA3 may initialized in the unknown (U)-state upon a copy to mirror. Upon failover to this controller (e.g., due to an online service-call for this memory controller), the directory may be reconstructed from the U-state.

As the operating frequency becomes increasingly higher (e.g., to improve performance), crosstalk increases its impact on both the time margin and voltage margin for the electrical performance of high speed Input/Output (HSIO) interface, such as DDR3 (Double-Data Rate 3) DRAM (Dynamic Random Access Memory) device. The sources of the crosstalk generally include the length/design of routing on the package, PTH (Plated Through Hole), socket design, and the length/design of routing on the motherboard. Except for the crosstalk from the socket, all the other crosstalk sources may be effectively reduced by increasing the routing spacing between the traces on the package/motherboard, and adding more Vss PTH close to the signal PTH. However, as the number one contributor of the crosstalk, socket crosstalk is very difficult to subdue in current implementations.

Figure 3:
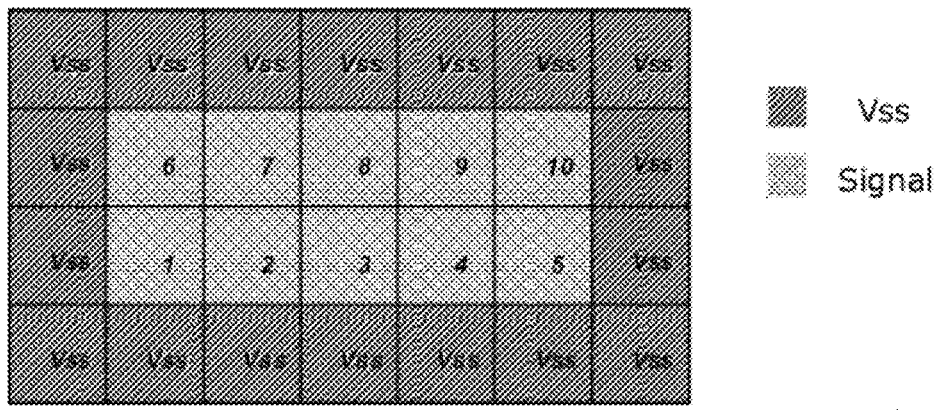
FIGS. 3-10 illustrate various views and embodiments of pins.

One current solution to control the socket crosstalk is to improve the signal-to-ground ratio on the pin map, e.g., by using Vss pins to shield the signals from each other. DDR3 interface, for example, usually has approximately 2.5:1 signal-to-ground-ratio. Socket G, for instance, has 96 Vss pins for totally 240 DDR3 signals to achieve a 2.5 signal-to-ground ratio. Even so, however, socket crosstalk can still easily reach 200 mV level and significantly impact the time and voltage margin. As a result, engineers generally have to add more Vss pins to improve signal-to-ground ratio, such as 1:1 ratio as shown in FIG. 3, according to an implementation; nevertheless, the downside of doing it is to increase the package size and therefore the cost.

Figure 4:
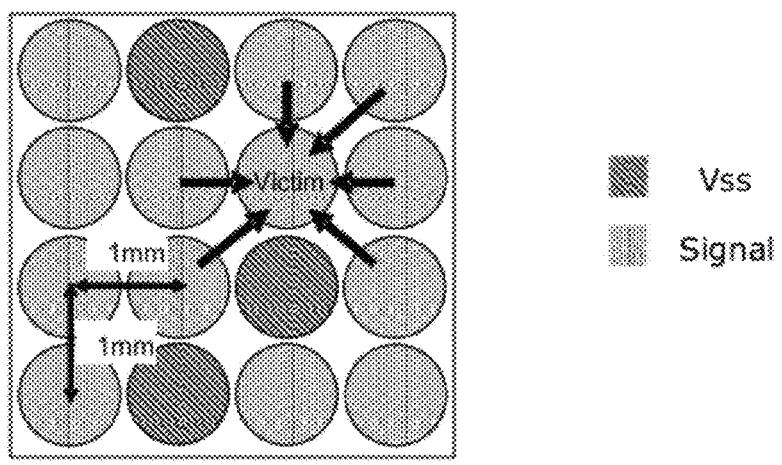

FIG. 4 shows how crosstalk works in some implementations. The victim signal is affected by its neighboring signals, called aggressors. And the amplitude of the crosstalk is very sensitive to the distance between the victim and aggressor, i.e., the closer they are, the more crosstalk they would have. It is clear that even with the presence of Vss pins in the signal pin field, a victim signal is still affected by crosstalk, for example, by its 5 or 6 closest neighbors (since their distance to the victim is not significantly different than the distance from the Vss pin to the victim, e.g., at 1 mm each way such as illustrated in FIG. 4).

Figure 5B:
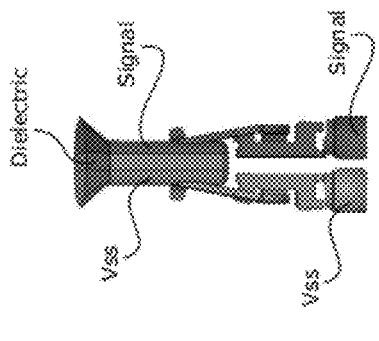
Figure 5A:
Figure 5A:
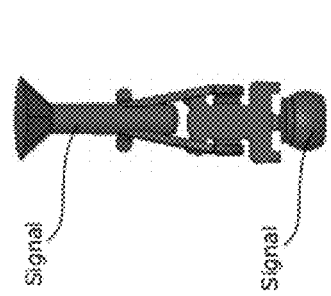

In order to significantly reduce the crosstalk from neighboring aggressors, it become necessary to make the Vss-to-victim distance much smaller than the aggressor-to-victim distance. One embodiment will provide an innovative solution for this. The conventional socket pin structure is shown in FIG. 5A, whereas an embodiment of a self-referencing socket is illustrated in FIG. 5B. As shown in FIG. 5B, the self-referencing socket pin may be created by inserting a layer of dielectric material, at least partially, between two portions (e.g., halves) of a socket pin. As show in FIG. 5B, even though the insulating material is disposed only partially along the portions of the pin (e.g., top part), the insulator may also be disposed along the whole of the separated portions of the pin in some embodiments. As a result, the pin portions will serve as a separate signal pin and ground pin. Then, the impedance of the new socket, 50 ohms for example, may be controlled by choosing the dielectric constant and the thickness of the dielectric material. Even though the pin is split into two portions, a pin may be split into more than two portions that are physically separated by an insulating material (such as dielectric or other insulating material discussed herein) in some embodiments.

Figure 6:
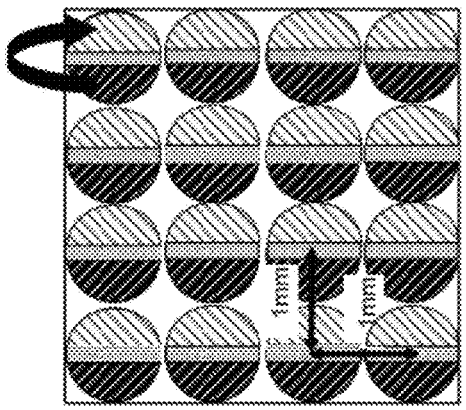

By using the self-referencing socket pin, the field for the new pin will look as shown in FIG. 6 in an embodiment. Because every signal is tightly referenced to its Vss pin portion, its crosstalk to other signal pins will be extremely weak, and therefore at least some of the Vss pins that are conventionally used to shield signals may be removed. Accordingly, package size and cost may be considerably reduced.

Figure 7:
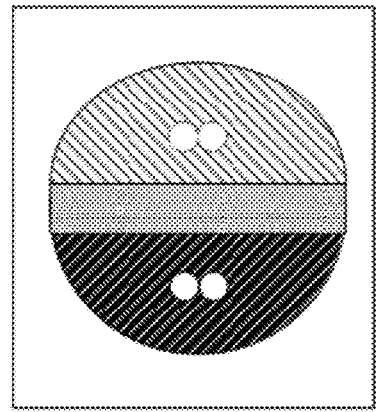

FIG. 7 shows that the Vss pin portions that may be connected to package and motherboard through Vss micro Vias (uVias—illustrated as little circles in FIG. 7 such as item 702), according to an embodiment.

Figure 8B:
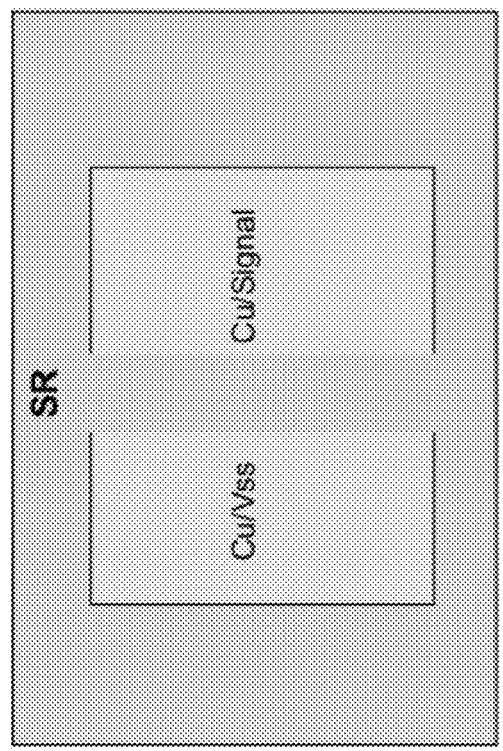
Figure 8A:
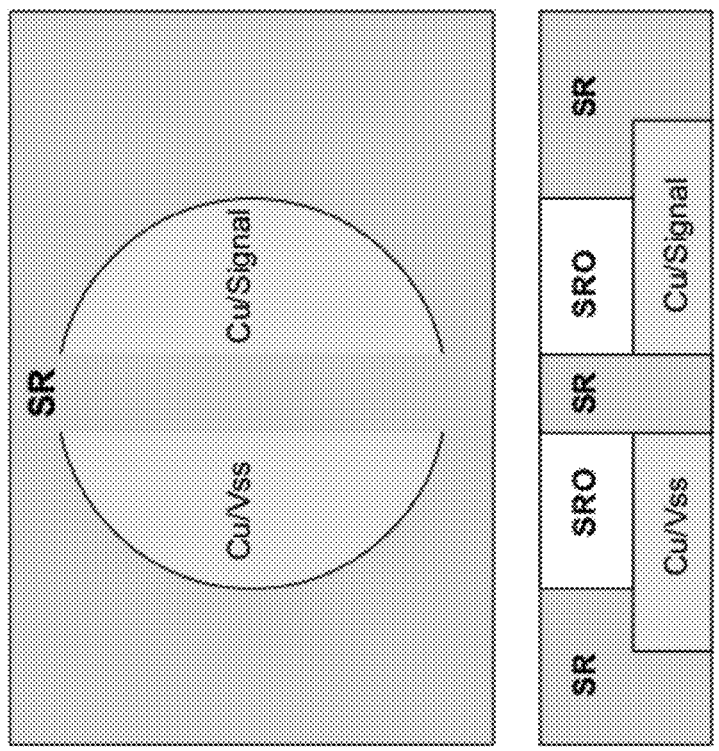

FIGS. 8A and 8B show pin pad and pin SRO (Solder Resist Opening) design on a package according to some embodiments. More specifically, FIG. 8A shows a top, cross-sectional view of a pin pad and SRO design and FIG. 8B illustrates a top, cross-sectional view of an alternative design for pin pad (rectangular), in accordance with some embodiments. As shown, a pin pad on a package may be divided by Copper (Cu) patterning and SR (Silicon Resist) barrier (see, e.g., bottom portion of FIG. 8A, 802). Both CU pattern and SR barrier changes may be made by lithography (Litho) GM (Glass Mask) change and/or SR printing process without any additional costs. The pad and SRO orientation may be designed in any angel/direction and shapes on package. In an embodiment, this can be controlled by adjusting Litho GM. In some embodiments, the pin portions may have a shape selected from a group comprising: a half moon shape, a circular shape, a rectangular shape, a square shape, or combinations thereof. Also, the pin pad design may be used in any pin receptacle (such as a motherboard, socket, package, etc.).

Figure 9:
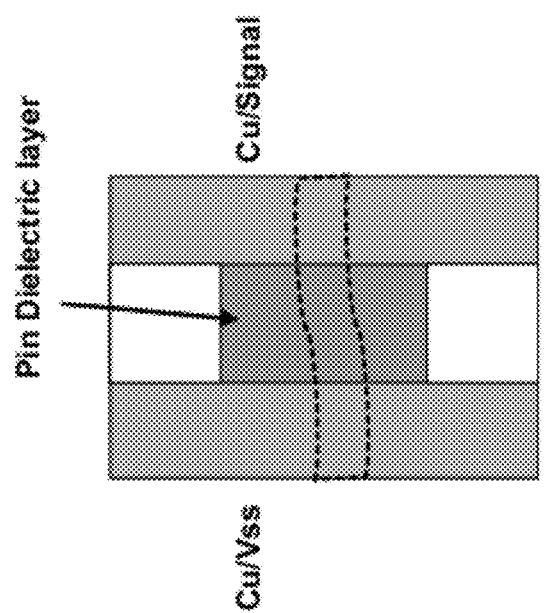

FIG. 9 illustrates a cross-sectional view for a pin design, according to an embodiment. The pin design of FIG. 9 may have any shape (e.g., including circular or rectangular shapes) or combination of different shapes. The pin may be manufactured with two (or more) separated (e.g., parallel) conductor pieces with an insulating layer/spacer between the conductors (e.g., disposed along a plane that is parallel to a length of the pin). The parts may be coupled by a clamp and/or epoxy. In some embodiments, the pin may be constructed of any conductive material including for example: copper, aluminum, silver, gold, or alloys (or other conductive composites) thereof. The insulators may be constructed of non-conductive material including for example: solid plastic, foam plastic, solid or flexible polyethylene (PE) insulator. Solid or flexible Teflon® ("PTFE" or PolyTetraFluoroEthylene), air (e.g., with spacers supporting/separating the (e.g., parallel) conducting pin portions), inert gas, or combinations thereof. In turn, the properties of dielectric may control some electrical properties of the pin and crosstalk performance. One choice of the spacers is a solid polyethylene (PE) insulator. Solid Teflon ("PTFE" or PolyTetraFluoroEthylene) may also be used as an insulator. Combinations of various material (such as the material discussed herein) may be used to manufacture the insulator layer. Also, the pin may be constructed in a similar fashion/shape as coaxial cables in some embodiments (e.g., with the signal portion being in the center and surrounded by Vss).

Figure 10:
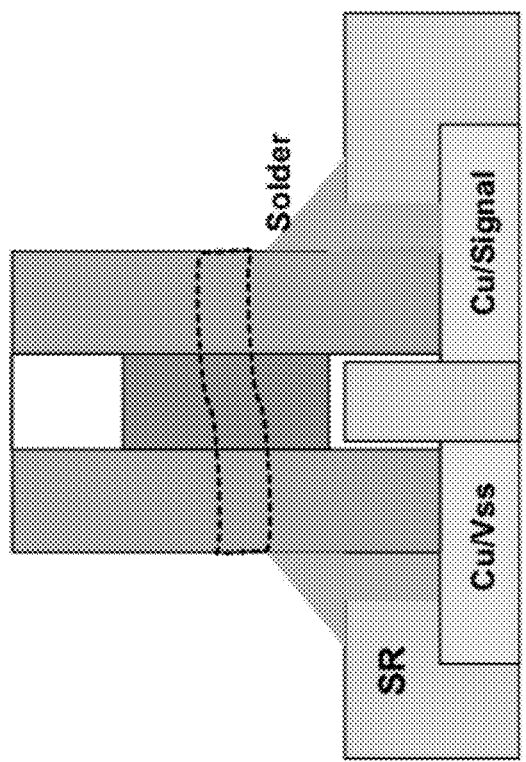

Referring to FIG. 10, a schematic drawing of a cross-section for a pin attached to a socket (e.g., pin of FIG. 9 attached to socket of FIG. 8A) is illustrated in accordance with an embodiment. The top and bottom pin designs may be, but is not required to be, the same for improved manufacturability on pin and pinning process. SR barrier provides both the needed insulating and pin orientating functions, which helps on pin and socket implementations.

As discussed herein, the material used for constructing the pins (including the insulation material and conductors) may be the same as or different from the construction material discussed with reference to FIGS. 1-10.

Figure 11:
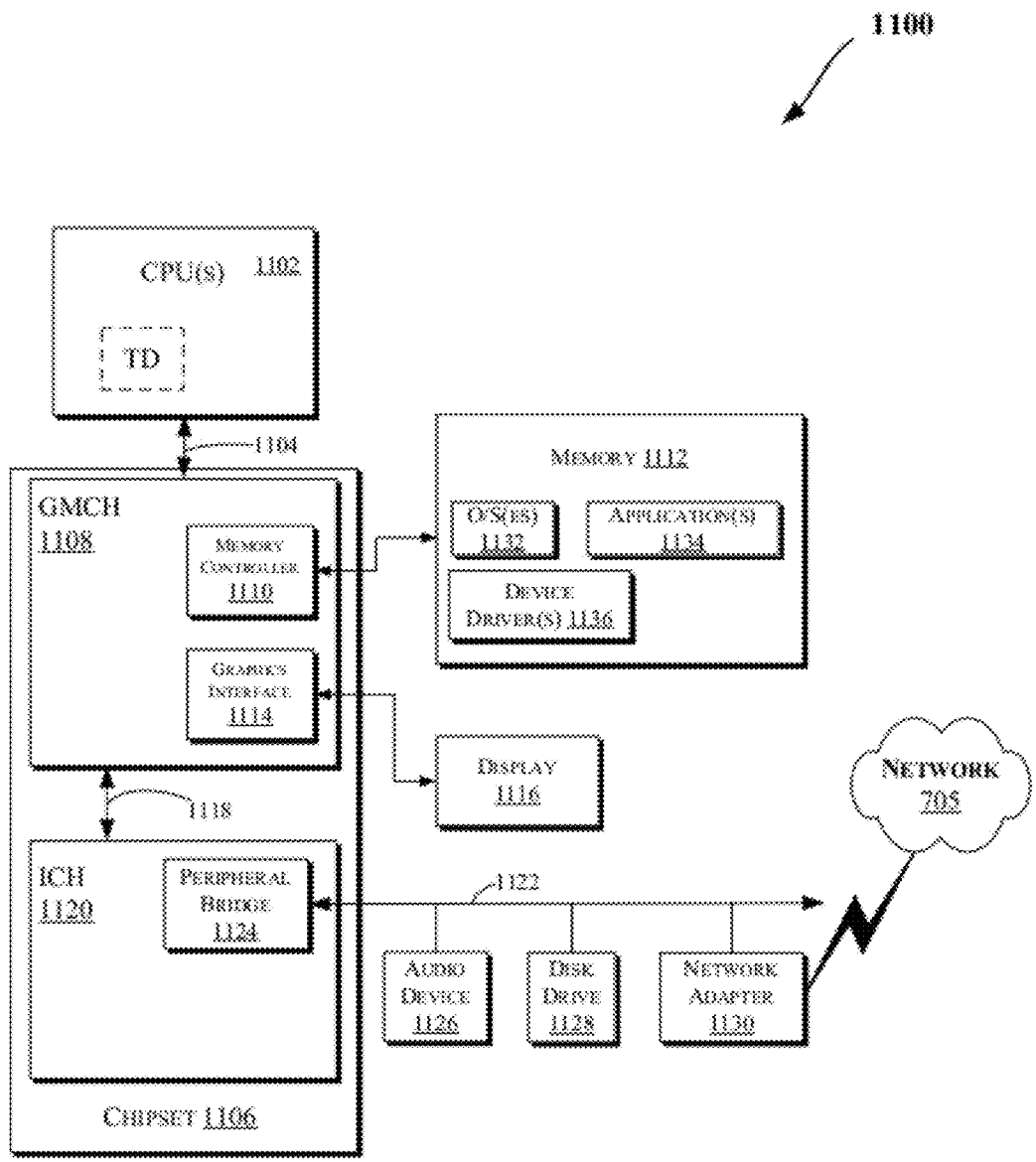

FIG. 11 illustrates a block diagram of an embodiment of a computing system 1100. One or more of the agents 102 of FIG. 1 may comprise one or more components of the computing system 1100. Also, various components of the system 1100 may be coupled via one or more pins (e.g., such as the pins discussed with reference to FIGS. 1-10). The computing system 1100 may include one or more central processing unit(s) (CPUs) 1102 (which may be collectively referred to herein as "processors 1102" or more generically "processor 1102") coupled to an interconnection network (or bus) 1104. The processors 1102 may be any type of processor such as a general purpose processor, a network processor (which may process data communicated over a computer network 1105), etc. (including a reduced instruction set computer (RISC) processor or a complex instruction set computer (CISC)). Moreover, the processors 1102 may have a single or multiple core design. The processors 1102 with a multiple core design may integrate different types of processor cores on the same integrated circuit (IC) die. Also, the processors 1102 with a multiple core design may be implemented as symmetrical or asymmetrical multiprocessors.

The processor 1102 may include one or more caches, which may be private and/or shared in various embodiments. Generally, a cache stores data corresponding to original data stored elsewhere or computed earlier. To reduce memory access latency, once data is stored in a cache, future use may be made by accessing a cached copy rather than refetching or recomputing the original data. The cache(s) may be any type of cache, such a level 1 (L1) cache, a level 2 (L2) cache, a level 3 (L3), a mid-level cache, a last level cache (LLC), etc. to store electronic data (e.g., including instructions) that is utilized by one or more components of the system 1100. Additionally, such cache(s) may be located in various locations (e.g., inside other components to the computing systems discussed herein, including systems of FIG. 1-10 or 12).

A chipset 1106 may additionally be coupled to the interconnection network 1104. Further, the chipset 1106 may include a graphics memory control hub (GMCH) 1108. The GMCH 1108 may include a memory controller 1110 that is coupled to a memory 1112. The memory 1112 may store data, e.g., including sequences of instructions that are executed by the processor 1102, or any other device in communication with components of the computing system 1100. Also, in one embodiment of the invention, the memory 1112 may include one or more volatile storage (or memory) devices such as random access memory (RAM), dynamic RAM (DRAM), synchronous DRAM (SDRAM), static RAM (SRAM), DDR (Double Data Rate) RAM, etc. Nonvolatile memory may also be utilized such as a hard disk. Additional devices may be coupled to the interconnection network 1104, such as multiple processors and/or multiple system memories.

The GMCH 1108 may further include a graphics interface 1114 coupled to a display device 1116 (e.g., via a graphics accelerator in an embodiment). In one embodiment, the graphics interface 1114 may be coupled to the display device 1116 via an accelerated graphics port (AGP). In an embodiment of the invention, the display device 1116 (such as a flat panel display) may be coupled to the graphics interface 1114 through, for example, a signal converter that translates a digital representation of an image stored in a storage device such as video memory or system memory (e.g., memory 1112) into display signals that are interpreted and displayed by the display 1116.

As shown in FIG. 11, a hub interface 1118 may couple the GMCH 1108 to an input/output control hub (ICH) 1120. The ICH 1120 may provide an interface to input/output (I/O) devices coupled to the computing system 1100. The ICH 1120 may be coupled to a bus 1122 through a peripheral bridge (or controller) 1124, such as a peripheral component interconnect (PCI) bridge that may be compliant with the PCIe specification, a universal serial bus (USB) controller, etc. The bridge 1124 may provide a data path between the processor 1102 and peripheral devices. Other types of topologies may be utilized. Also, multiple buses may be coupled to the ICH 1120, e.g., through multiple bridges or controllers. Further, the bus 1122 may comprise other types and configurations of bus systems. Moreover, other peripherals coupled to the ICH 1120 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), etc.

The bus 1122 may be coupled to an audio device 1126, one or more disk drive(s) 1128, and a network adapter 1130 (which may be a NIC in an embodiment). In one embodiment, the network adapter 1130 or other devices coupled to the bus 1122 may communicate with the chipset 1106. Also, various components (such as the network adapter 1130) may be coupled to the GMCH 1108 in some embodiments of the invention. In addition, the processor 1102 and the GMCH 1108 may be combined to form a single chip. In an embodiment, the memory controller 1110 may be provided in one or more of the CPUs 1102. Further, in an embodiment, GMCH 1108 and ICH 1120 may be combined into a Peripheral Control Hub (PCH).

Additionally, the computing system 1100 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 1128), a floppy disk, a compact disk ROM (CD-ROM), a digital versatile disk (DVD), flash memory, a magneto-optical disk, or other types of nonvolatile machine-readable media capable of storing electronic data (e.g., including instructions).

The memory 1112 may include one or more of the following in an embodiment: an operating system (O/S) 1132, application 1134, and/or device driver 1136. The memory 1112 may also include regions dedicated to Memory Mapped I/O (MMIO) operations. Programs and/or data stored in the memory 1112 may be swapped into the disk drive 1128 as part of memory management operations. The application(s) 1134 may execute (e.g., on the processor(s) 1102) to communicate one or more packets with one or more computing devices coupled to the network 1105. In an embodiment, a packet may be a sequence of one or more symbols and/or values that may be encoded by one or more electrical signals transmitted from at least one sender to at least on receiver (e.g., over a network such as the network 1105). For example, each packet may have a header that includes various information which may be utilized in routing and/or processing the packet, such as a source address, a destination address, packet type, etc. Each packet may also have a payload that includes the raw data (or content) the packet is transferring between various computing devices over a computer network (such as the network 1105).

In an embodiment, the application 1134 may utilize the O/S 1132 to communicate with various components of the system 1100, e.g., through the device driver 1136. Hence, the device driver 1136 may include network adapter 1130 specific commands to provide a communication interface between the O/S 1132 and the network adapter 1130, or other I/O devices coupled to the system 1100, e.g., via the chipset 1106.

In an embodiment, the O/S 1132 may include a network protocol stack. A protocol stack generally refers to a set of procedures or programs that may be executed to process packets sent over a network 1105, where the packets may conform to a specified protocol. For example, TCP/IP (Transport Control Protocol/Internet Protocol) packets may be processed using a TCP/IP stack. The device driver 1136 may indicate the buffers in the memory 1112 that are to be processed, e.g., via the protocol stack.

The network 1105 may include any type of computer network. The network adapter 1130 may further include a direct memory access (DMA) engine, which writes packets to buffers (e.g., stored in the memory 1112) assigned to available descriptors (e.g., stored in the memory 1112) to transmit and/or receive data over the network 1105. Additionally, the network adapter 1130 may include a network adapter controller, which may include logic (such as one or more programmable processors) to perform adapter related operations. In an embodiment, the adapter controller may be a MAC (media access control) component. The network adapter 1130 may further include a memory, such as any type of volatile/nonvolatile memory (e.g., including one or more cache(s) and/or other memory types discussed with reference to memory 1112).

Figure 12:
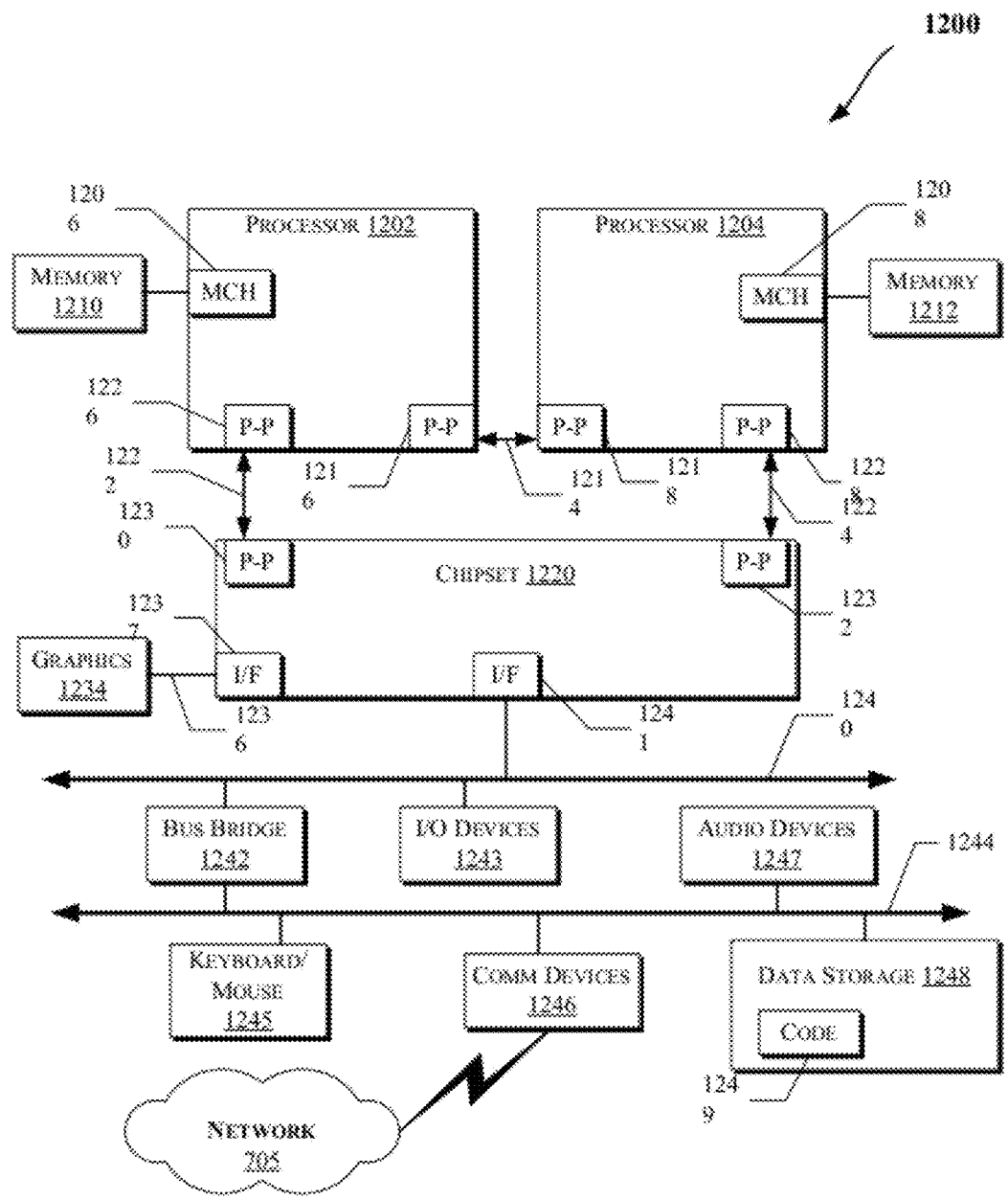

FIG. 12 illustrates a computing system 1200 that is arranged in a point-to-point (PtP) configuration, according to an embodiment of the invention. In particular, FIG. 12 shows a system where processors, memory, and input/output devices are interconnected by a number of point-to-point interfaces. The operations discussed with reference to FIGS. 1-11 may be performed by one or more components of the system 1200.

As illustrated in FIG. 12, the system 1200 may include several processors, of which only two, processors 1202 and 1204 are shown for clarity. The processors 1202 and 1204 may each include a local memory controller hub (GMCH) 1206 and 1208 to enable communication with memories 1210 and 1212. The memories 1210 and/or 1212 may store various data such as those discussed with reference to the memory 1212 of FIG. 12. As shown in FIG. 12, the processors 1202 and 1204 (or other components of system 1200 such as chipset 1220, I/O devices 1243, etc.) may also include one or more cache(s) such as those discussed with reference to FIGS. 1-11.

In an embodiment, the processors 1202 and 1204 may be one of the processors 1202 discussed with reference to FIG. 12. The processors 1202 and 1204 may exchange data via a point-to-point (PtP) interface 1214 using PtP interface circuits 1216 and 1218, respectively. Also, the processors 1202 and 1204 may each exchange data with a chipset 1220 via individual PtP interfaces 1222 and 1224 using point-to-point interface circuits 1226, 1228, 1230, and 1232. The chipset 1220 may further exchange data with a high-performance graphics circuit 1234 via a high-performance graphics interface 1236, e.g., using a PtP interface circuit 1237.

In at least one embodiment, one or more pins (such as those discussed with reference to FIGS. 1-11) may be used to couple various components of FIG. 12, e.g., including one or more of the processors 1202, 1204, memories 1210, 1212, and/or chipset 1220. Other embodiments of the invention, however, may exist in other circuits, logic units, or devices within the system 1200 of FIG. 12. Furthermore, other embodiments of the invention may be distributed throughout several circuits, logic units, or devices illustrated in FIG. 12.

The chipset 1220 may communicate with the bus 1240 using a PtP interface circuit 1241. The bus 1240 may have one or more devices that communicate with it, such as a bus bridge 1242 and I/O devices 1243. Via a bus 1244, the bus bridge 1242 may communicate with other devices such as a keyboard/mouse 1245, communication devices 1246 (such as modems, network interface devices, or other communication devices that may communicate with the computer network 1105), audio I/O device, and/or a data storage device 1248. The data storage device 1248 may store code 1249 that may be executed by the processors 1202 and/or 1204.

In various embodiments of the invention, the operations discussed herein, e.g., with reference to FIGS. 1-12, may be implemented as hardware (e.g., circuitry), software, firmware, microcode, or combinations thereof, which may be provided as a computer program product, e.g., including a machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-12. Additionally, such computer-readable media may be downloaded as a computer program product, wherein the program may be transferred from a remote computer (e.g., a server) to a requesting computer (e.g., a client) through data signals provided in a carrier wave or other propagation medium via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
a pin to electrically couple a first agent to a second agent, wherein the pin is to comprise a plurality of portions that are at least partially separated by an insulator,
wherein the insulator is to electrically insulate the plurality of portions of the pin,
wherein one of the plurality of pin portions is to carry a signal and another one of the plurality of pin portions is to carry a ground signal, wherein the plurality of pin portions are to have a half moon shape, and wherein a plurality of pins are arranged to have a signal carrying portion of a first pin be adjacent to a ground signal carrying portion of a second pin and a signal carrying portion of the second pin be adjacent to a ground signal carrying portion of a third pin.

2. The apparatus of claim 1, wherein the plurality of pin portions are to have a shape selected from a group comprising: the half moon shape, a circular shape, a rectangular shape, a square shape, or combinations thereof.

3. The apparatus of claim 1, wherein the pin is to be attached via a pin pad to a socket, package, or a motherboard.

4. The apparatus of claim 1, wherein the pin is constructed of a conductive material comprising: copper, aluminum, silver, gold, alloys thereof, or conductive composites thereof.

5. The apparatus of claim 1, wherein the insulator is constructed of a non-conductive material comprising: solid plastic, foam plastic, solid or flexible polyethylene (PE) insulator, solid or flexible Teflon® ("PTFE" or PolyTetraFluoroEthylene), air, inert gas, or combinations thereof.

6. The apparatus of claim 1, wherein the plurality of pin portions are to comprise only two pin portions, wherein a first portion of the two pin portions is to be in a center of the pin and a second portion of the two pin portions is to surround the first pin portion.

7. The apparatus of claim 1, wherein the first agent or the second are selected from a group comprising: a processor, a chipset, a memory controller, a memory device, graphics controller, an input/output hub, a hard drive, a communication device, or an input/output device.

8. The apparatus of claim 1, wherein the first agent is to comprise a memory controller and the second agent is to comprise a memory.

9. The apparatus of claim 8, wherein the memory is to comprise a Double-Data Rate (DDR) memory.

10. The apparatus of claim 1, wherein the first agent or the second agent are to comprise a processor.

11. The apparatus of claim 10, wherein the processor is to comprise a plurality of processor cores.

12. The apparatus of claim 1, wherein each of the half moon shapes is to include a plurality of micro vias to couple to one of a socket, a package, and a motherboard.

13. A system comprising:
a memory to store data;
one or more pins to electrically couple the memory to an electronic component, wherein each of the one or more pins is to comprise:
a plurality of portions that are at least partially separated by an insulator,
wherein the insulator is to electrically insulate the plurality of portions, wherein one of the plurality of pin portions is to carry a signal and another one of the plurality of pin portions is to carry a ground signal, wherein the plurality of pin portions are to have a half moon shape, and wherein a plurality of pins are arranged to have a signal carrying portion of a first pin be adjacent to a ground signal carrying portion of a second pin and a signal carrying portion of the second pin be adjacent to a ground signal carrying portion of a third pin.

14. The system of claim 13, wherein the plurality of pin portions are to have a shape selected from a group comprising: the half moon shape, a circular shape, a rectangular shape, a square shape, or combinations thereof.

15. The system of claim 13, wherein the one or more pins are to be attached via a pin pad to a socket, package, or a motherboard.

16. The system of claim 13, wherein the one or more pins are constructed of a conductive material comprising: copper, aluminum, silver, gold, alloys thereof, or conductive composites thereof.

17. The system of claim 13, wherein the insulator is constructed of a non-conductive material comprising: solid plastic, foam plastic, solid or flexible polyethylene (PE) insulator, solid or flexible Teflon® ("PTFE" or PolyTetraFluoroEthylene), air, inert gas, combinations thereof.

18. The system of claim 13, wherein each of the half moon shapes is to include a plurality of micro vias to couple to one of a socket, a package, and a motherboard.

* * * * *